United States Patent
Wege et al.

(10) Patent No.: US 6,541,372 B2
(45) Date of Patent: Apr. 1, 2003

(54) METHOD FOR MANUFACTURING A CONDUCTOR STRUCTURE FOR AN INTEGRATED CIRCUIT

(75) Inventors: Stephan Wege, Weissig (DE); Peter Moll, Dresden (DE)

(73) Assignee: Infineon Technologies AG, Munich (DE)

(*) Notice: Subject to any disclaimer, the term of this patent is extended or adjusted under 35 U.S.C. 154(b) by 72 days.

(21) Appl. No.: 09/801,213

(22) Filed: Mar. 7, 2001

(65) Prior Publication Data

US 2002/0009876 A1 Jan. 24, 2002

(30) Foreign Application Priority Data

Mar. 7, 2000 (DE) ......................................... 100 11 886

(51) Int. Cl.⁷ .......................................... H01L 21/4763
(52) U.S. Cl. ....................... 438/633; 438/637; 438/687; 438/672
(58) Field of Search ................................ 438/633, 637, 438/672, 687, FOR 355, FOR 405; 204/192.32, 192.35

(56) References Cited

U.S. PATENT DOCUMENTS

| | | | |
|---|---|---|---|
| 4,026,742 A | | 5/1977 | Fujino |
| 4,184,909 A | * | 1/1980 | Chang et al. .......... 204/192.25 |
| 4,215,156 A | * | 7/1980 | Dalal et al. ............ 204/192.17 |
| 4,312,113 A | * | 1/1982 | Calviello ............. 148/DIG. 84 |
| 4,362,597 A | * | 12/1982 | Fraser et al. ........... 204/192.32 |
| 5,229,325 A | * | 7/1993 | Park et al. .................. 438/622 |
| 5,366,929 A | | 11/1994 | Cleeves et al. |
| 5,817,572 A | | 10/1998 | Chiang et al. |
| 5,846,884 A | | 12/1998 | Naeem et al. |
| 5,985,758 A | * | 11/1999 | Kim ........................... 438/632 |
| 5,985,762 A | | 11/1999 | Geffken et al. |
| 5,990,001 A | * | 11/1999 | Oda ........................... 438/633 |
| 5,998,250 A | | 12/1999 | Andricacos et al. |
| 5,998,296 A | * | 12/1999 | Saran et al. ................ 438/625 |
| 6,010,603 A | | 1/2000 | Ye et al. |
| 6,017,816 A | * | 1/2000 | Ni et al. ..................... 438/636 |
| 6,027,860 A | | 2/2000 | McClure et al. |
| 6,114,242 A | * | 9/2000 | Sun et al. ............. 427/255.394 |
| 6,130,162 A | * | 10/2000 | Liu et al. .................... 438/643 |
| 6,277,726 B1 | * | 8/2001 | Kitch et al. ................ 257/758 |
| 6,372,645 B1 | * | 4/2002 | Liu et al. .................... 438/627 |
| 6,383,914 B1 | * | 5/2002 | Yasuda ....................... 438/625 |
| 6,391,771 B1 | * | 5/2002 | Naik et al. .................. 257/751 |
| 6,424,036 B1 | * | 7/2002 | Okada ........................ 257/508 |

FOREIGN PATENT DOCUMENTS

JP 05041380 A * 2/1993

* cited by examiner

Primary Examiner—Olik Chaudhuri
Assistant Examiner—Michele Estrada
(74) Attorney, Agent, or Firm—Laurence A. Greenberg; Werner H. Stemer; Gregory L. Mayback (57) ABSTRACT

A simple to manufacture conductor structure is described which requires only a small number of process steps. The conductor structure contains a structured, first insulating layer to which a first passivation layer is applied. A layer of conductive material is applied thereto and in turn a second passivation layer is applied to the layer of conductive material. A hard mask is applied to the second passivation layer. The layer of conductive material is removed in regions defined by the hard mask. The first passivation layer is removed in the regions defined by the hard mask by sputtering and is at least partially deposited again on the side wall of the layer of conductive material.

18 Claims, 6 Drawing Sheets

METHOD FOR MANUFACTURING A CONDUCTOR STRUCTURE FOR AN INTEGRATED CIRCUIT

BACKGROUND OF THE INVENTION

Field of the Invention

The invention relates to a method for manufacturing a conductor structure for an integrated circuit. The structures of such integrated circuits extend in the submicron range in this context. Integrated circuits have a microelectronic circuit that is applied to a common carrier (substrate) and has a multiplicity of components. The degree of integration, a measure of the number of electronic components on the chip, can be very large scale integration (VLSI), ultra-large scale integration (ULSI) or greater.

Wide-ranging problems occur in particular in the manufacture of the metal layers of an integrated electronic circuit. If the metal layer is implemented with copper, there is the risk of corrosion when structuring the copper. This is due to the fact that, after the etching of the copper, residues of the etching material attack the exposed copper faces. In addition, there is the further disadvantageous factor that during chemical etching copper can only be removed at temperatures at which the photoresist liquefies or even burns. U.S. Pat. No. 4,026,742 discloses a plasma etching method for manufacturing an integrated circuit. Here too there is the problem that, if liquid etching solutions are used, the etching mask, which is manufactured from a photoresistive material, disappears or peels off during the etching, with the result that precise structuring is difficult. In U.S. Pat. No. 4,026,742, it is proposed to overcome this problem by manufacturing the integrated circuit in the reaction chamber with a gas which has a halogen component used in a plasma state with a high-frequency electromagnetic field. The halogenated metal regions are removed by sublimation, vaporization or washing with water or some other suitable solution. In the process, the exposed metal is converted using a reactive halogenated gas in the plasma state into a metal halide and removed in order to structure the electrically conductive metal. The plasma can be produced in the reaction chamber with a high-frequency electromagnetic field. The method is used to produce the desired structure of the metal for electrodes or lines on the semiconductor substrate or other microelectrical carriers. It is used in particular for etching tungsten or molybdenum metal structures. The halogenated gas contains essentially dichlorodifluoromethane. The power source operates with a current of 180 mA at 1200 V and a frequency of 13.56 MHz. Because the plasma is at more than 10,000° C., the material of the chamber must be appropriately configured in order to be able to withstand the reactions that take place. It is disadvantageous here that the reaction chamber has to meet particular requirements.

U.S. Pat. No. 5,817,572 discloses a further method for manufacturing connections between connecting channels. In this document, the dual damascene process is described. A dielectric layer is deposited and structured by a two-stage etching process. In the first stage of the etching process, a greater part of the dielectric layer is etched within the contact orifices. In the second step, the connection channels and the rest of the dielectric layer are removed by etching within the contact orifices. The depth of the connection channels is difficult to control owing to the deposition of film and the unequal removal by etching. The depth of the connection channels may be too large in the center of the wafer and too small at the edge of the wafer. This results in large differences in the connection resistances on the same wafer. The deposition of metal is difficult because the contact orifices may have a side ratio (ratio of height to width) of 2:1, 3:1 or more. The large side ratios make sputter deposition virtually impossible. A metal layer can be deposited within the contact orifices and the connection channels by chemical vapor deposition. Nevertheless, connecting materials such as aluminum, copper, gold and silver are not typically deposited using chemical vapor deposition. However, polysilicon and tungsten can be deposited using chemical vapor deposition. The dual damascene process is therefore not very suitable for manufacturing the desired conductor structure or an integrated circuit.

SUMMARY OF THE INVENTION

It is accordingly an object of the invention to provide a method for manufacturing a conductor structure for an integrated circuit which overcomes the above-mentioned disadvantages of the prior art methods of this general type, in which the passivation of the metal layer is simple and can be carried out with just a small number of process steps.

With the foregoing and other objects in view there is provide, in accordance with the invention, a method for manufacturing a conductor structure for an integrated circuit. The method includes the steps of providing a structured, insulating layer; applying a first passivation layer to the structured, insulating layer; applying a layer of conductive material to the first passivation layer; applying a second passivation layer to the layer of conductive material; applying a hard mask to the second passivation layer; removing the layer of conductive material in regions defined by the hard mask; and removing the first passivation layer in the regions defined by hard mask by sputtering. Parts of the first passivation layer are at least partially deposited again on a side wall of the layer of conductive material due to the sputtering step.

The layer of conductive material can be removed by reactive ion etching.

The layer of conductive material can also be removed by sputtering.

The layer of conductive material advantageously contains copper. Copper has a relatively low ohmic resistance.

The thickness of the layer of the conductive material is between 300 nm and 500 nm.

The passivation layers can contain tantalum, tantalum nitride or both.

The first insulating layer advantageously contains a silicon oxide or a material with a dielectric constant that is lower than that of silicon oxide.

The hard mask can contain silicon nitride, silicon oxynitride or silicon oxide.

The thickness of the hard mask is advantageously between 100 nm and 300 nm.

The thickness of the first and second passivation layers is advantageously approximately 20 nm in each case.

The surface can be provided with a third passivation layer.

The surface can also be provided with a second insulating layer.

If the surface is provided with a second insulating layer, it has to be subsequently chemical-mechanically polished.

The wafer is advantageously cooled during the sputtering.

It is also advantageous to feed in nitrogen during the sputtering.

The structured, first insulating layer can be produced by reactive ion etching.

The layer of conductive material can be structured by heating the wafer and carrying out subsequent reactive ion etching.

The hard mask can be produced by first depositing the hard mask material by a chemical vapor deposition process. Subsequently, an antireflex layer is applied, over which a photoresist mask is applied. The hard mask material is then removed by etching in the regions provided by the photoresist mask. Finally, the antireflex layer and the photoresist mask are removed.

Other features which are considered as characteristic for the invention are set forth in the appended claims.

Although the invention is illustrated and described herein as embodied in a method for manufacturing a conductor structure for an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a layered structure in cross section having a first insulating layer 2 applied to a substrate 1. An antireflex layer 3, covered by a photoresist layer 4, is shown above the first insulating layer 2. The antireflex layer 3 and the first insulating layer 2 have already been removed in regions defined by the photomask 4, with the result that a contacting hole (via) 14 is thus formed. The removal of the first insulating layer 2 is carried out by a conventional etching method.

Figure 1:
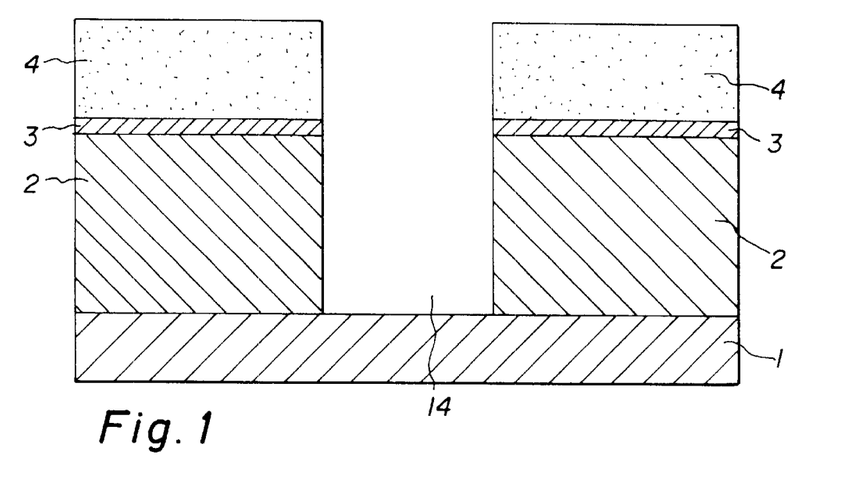
FIG. 1 is a diagrammatic, sectional view of a layered structure with a substrate, an insulating layer, an anti-reflex layer, a photoresist and a contact hole according to the invention.

Material which is suitable for lithography in the low end of the UV range can be used as the photoresist layer 4.

The antireflex layer 3 is used, during the photographic exposure, for avoiding reflections on the underlying surface, in the present case the first insulating layer 2.

The first insulating layer 2 is a dielectric that contains an oxide.

The trench in the insulating layer 2 has a horizontal width of approximately 200 nm and a vertical height of approximately 600 nm, which corresponds to a thickness of the first insulating layer 2.

Figure 2:
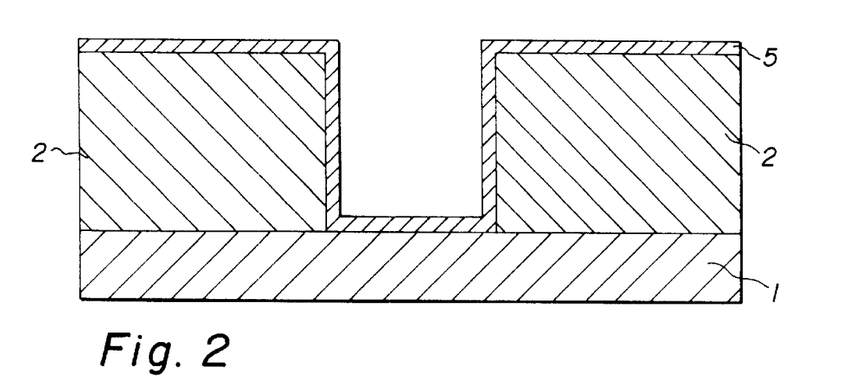
FIG. 2 is a sectional view of the layered structure after the removal of the photoresist layer and the anti-reflex layer, and a first passivation layer has been applied.

After the photoresist layer 4 and the antireflex layer 3 have been removed, a first passivation layer 5 is applied in accordance with FIG. 2.

The first passivation layer 5 has a thickness of approximately 20 nm and is used to prevent copper corrosion, which would occur if the copper came into contact with the insulating layer 2. The first passivation layer 5 serves simultaneously as a diffusion barrier. The first passivation layer 5 (liner) may contain tantalum Ta, tantalum nitride TaN, or even both materials. The first passivation layer 5 covers, according to FIG. 2, both the first insulating layer 2 and the region of the substrate 1 in which the first insulating layer 2 has been removed.

Figure 3:
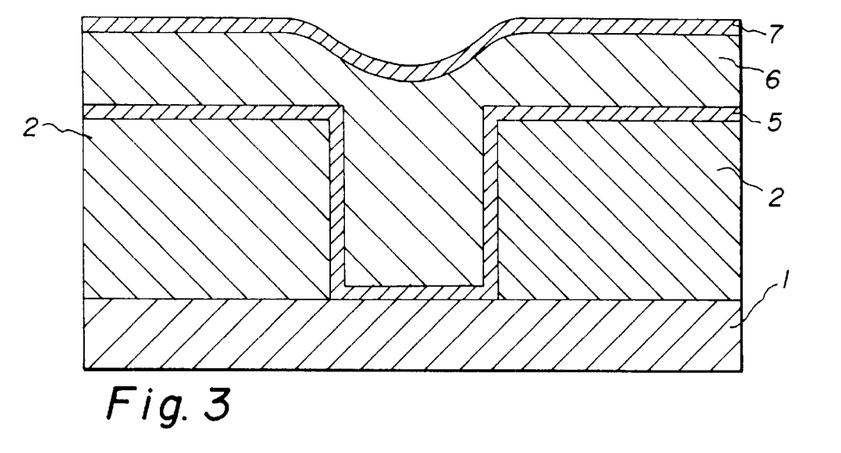
FIG. 3 is a sectional view of the layered structure with a metal filling the contact hole and a second passivation layer.

In the next process step, as shown in FIG. 3, a metal layer 6 made of copper Cu is applied to the first insulating layer 5. The metal layer 6 is completely separated from the first insulating layer 2, by the first passivation layer 5. This avoids corrosion of the copper, as already mentioned. In addition, a second passivation layer 7, which also serves as a diffusion barrier, is applied above the metal layer 6.

The metal layer 6 is between 300 nm and 500 nm, preferably approximately 350 nm, thick. The second passivation layer 7 has approximately the same thickness as the first passivation layer 2, namely approximately 20 nm. The second passivation layer 7 can also correspond to the first passivation layer 5 in terms of the composition of the material.

The metal layer 6 can be applied by electroplating. The metal used is copper. Copper has the advantage that it has a relatively low ohmic resistance.

Figure 4:
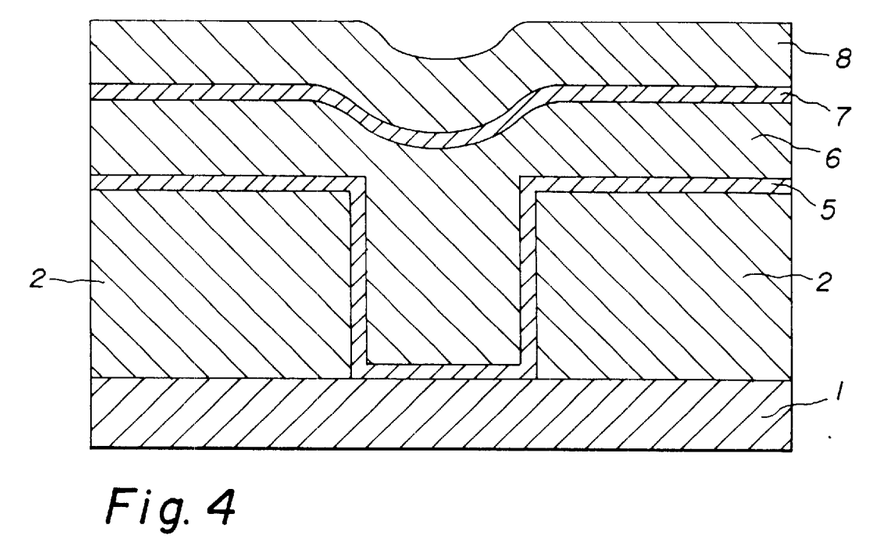
FIG. 4 is a sectional view of the layered structure with additionally deposited hard mask material.

In the layer structure shown in FIG. 4, a layer 8 with a thickness of approximately 250 nm has been applied above the second passivation layer 7. The layer 8 serves as a hard mask after structuring. The material used can be silicon nitride or silicon oxynitride. The hard mask material 8 can be deposited by chemical vapor deposition (CVD).

Figure 5:
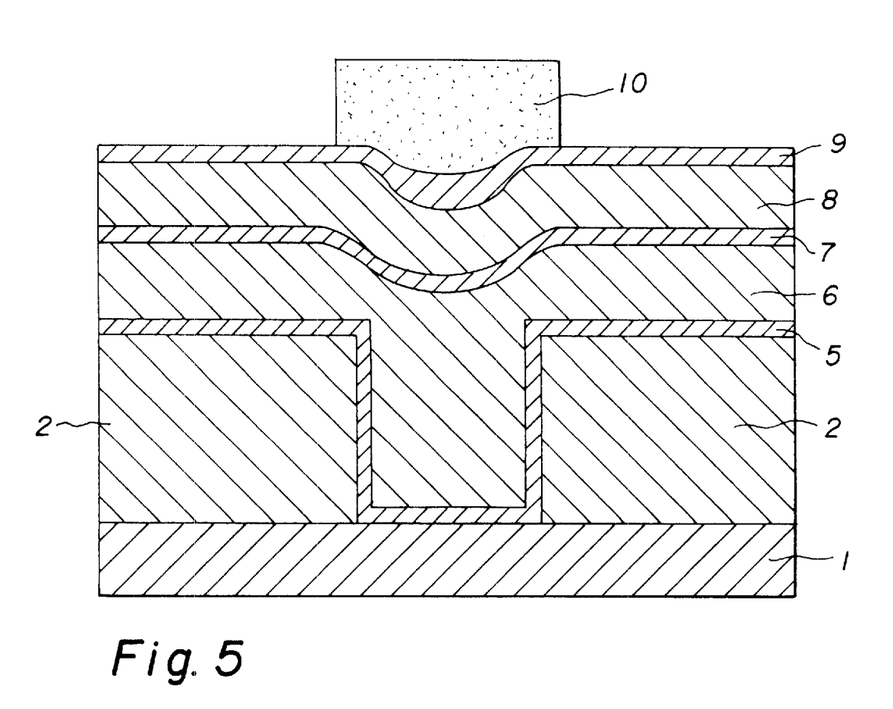
FIG. 5 is a sectional view of the layered structure with the applied antireflex layer and a photoresist mask.

In a further process step, a further antireflex layer 9 is applied over the layer 8 in accordance with FIG. 5, the further antireflex layer 9 also reducing, inter alia, a depth of a depression in the central region of the layer 8. organic material is advantageously used as the further antireflex layer 9. A photomask 10 made of photoresist is disposed above the further antireflex layer 9.

Figure 6:
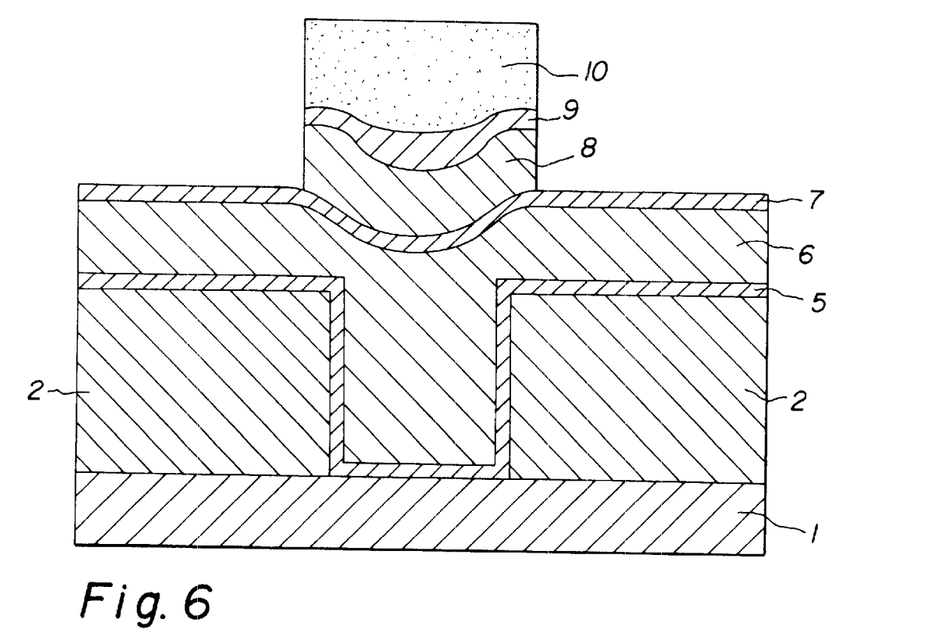
FIG. 6 is a sectional view of the layered structure with the hard mask after structuring.

After the further antireflex layer 9 and the layer 8 have been removed in the regions defined by the photomask 10 by etching, the layer structure shown in FIG. 6 is produced. The etching is carried out until the second passivation layer 7 is reached. The second passivation layer 7 must not be etched through in this process.

The photomask 10 and the further antireflex layer 9 are then removed. This results in the layered structure shown in FIG. 7. The removal of the photomask 10 and of the further antireflex layer 9 is carried out by dry stripping or wet cleaning.

Figure 7:
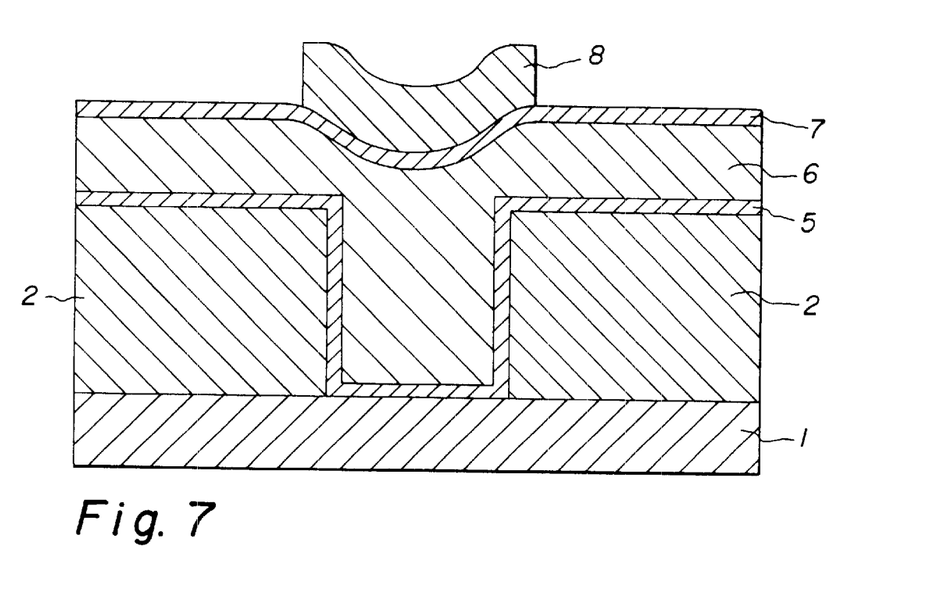
FIG. 7 is a sectional view of the layered structure after the removal of the photoresist mask and of the antireflex layer.
Figure 8:
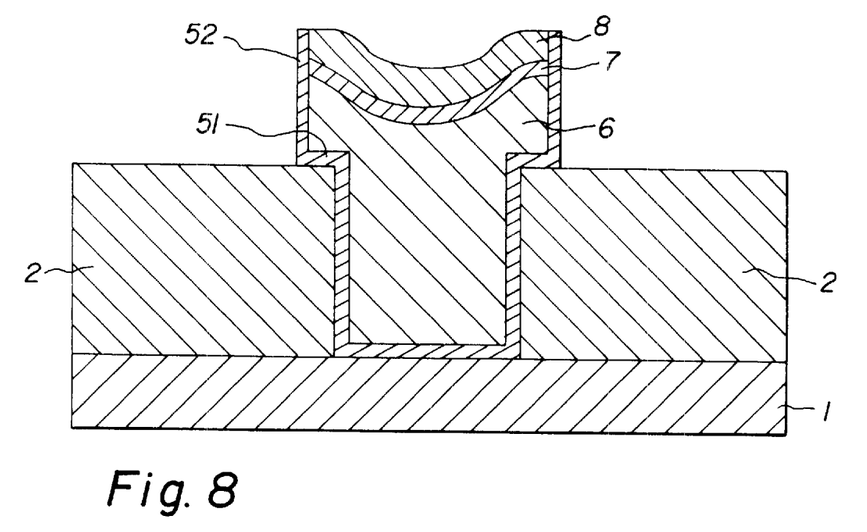
FIG. 8 is a sectional view of the layered structure after the partial removal of the second passivation layer, the metal layer and the first passivation layer as well as a deposition of a further passivation layer on the side walls.

In a further process step, both the second passivation layer 7 and the metal layer 6 are removed in the regions predefined by the hard mask 8. The removal of the second passivation layer 7 and of the metal layer 6 can be carried out by reactive ion etching or else by sputtering.

The copper metal layer 6 can be structured by reactive ion etching (RIE) using etching gases such as hydrochloric acid HCl or chlorine $Cl_2$ supported by argon Ar or zenon Ze.

The first passivation layer 5 is sputtered off the first insulating layer 2 by impacting with ions (sputtering) and is at least partially sputtered, as a side wall passivation layer 52, onto the side region of the metal layer 6, the second insulating layer 7 and the hard mask 8. This ensures that the side walls are cleaned by the sputtering and a satisfactory degree of passivation of the side walls by sputtered-back passivation material is obtained. Before the start of the sputtering, the chemically active components (for example $Cl_2$) must be removed by pumping out of the plasma. Selective cooling of the wafer reinforces the deposition of the passivation material on the side walls. In addition, nitrogen can be used to saturate the Ta bonds in the process chamber.

The side walls can be passivized during the etching by adding an additive. The additive used can be inorganic material, for example nitrogen $N_2$ or oxygen $O_2$. The organic material used is $CHF_3$ or $CH_4$.

This passivation layer must be removed again during the sputtering step.

During layer removal, care is to be taken to ensure that it results in the thickness of the hard mask 8 being reduced.

Figure 9:
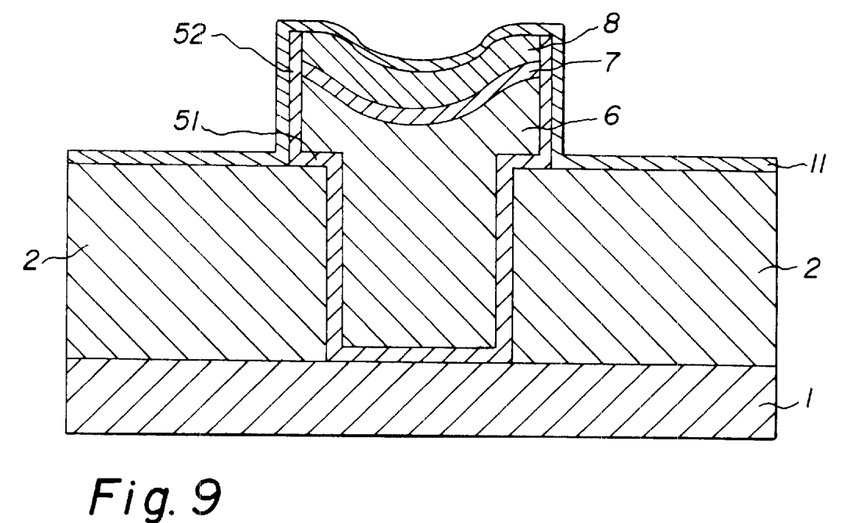
FIG. 9 is a sectional view of the layered structure with an optional third passivation layer.

The parts of the first passivation layer 5 that are not sputtered off are designated by 51 in FIG. 8. The newly applied passivation layer on the side walls is designated by 52.

Where necessary, a coating with a third passivation 11 layer can be provided in accordance with FIG. 9. The third passivation layer 11 here covers parts of the first insulating layer 2, parts of the first passivation layer 5 and the hard mask 8.

The third passivation layer 11 has a thickness of approximately 30 nm and may contain silicon nitride. The third passivation layer 11 is necessary only if the passivation layer 52 is not sufficient.

Figure 10:
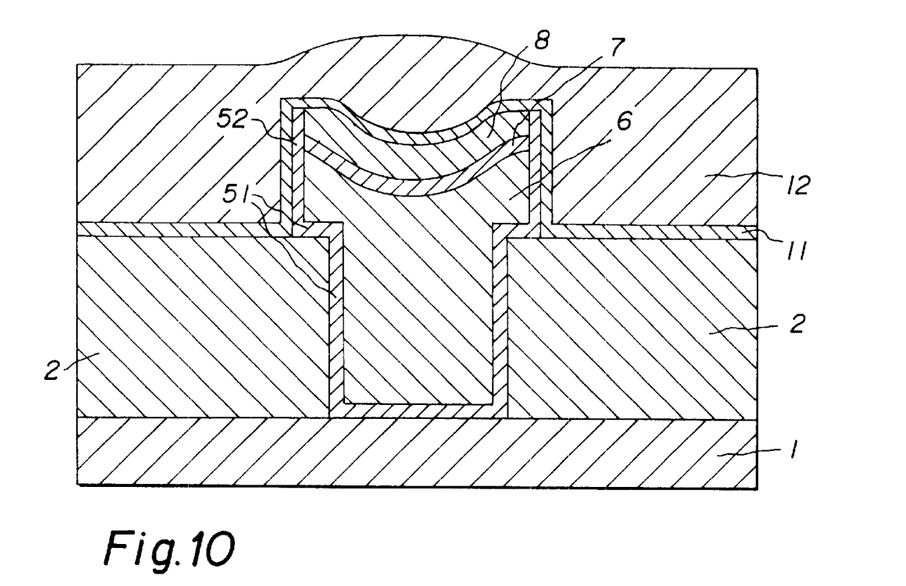
FIG. 10 is a sectional view of the layered structure with the optional third passivation layer and a second insulation layer.

In FIG. 10, a second insulating layer 12 has been applied over the optional third passivation layer 11.

The second insulating layer 12 is also a dielectric, for example a silicon oxide or a material whose dielectric constant is lower than that of silicon oxide, and has a layer thickness of approximately 600 nm.

Figure 11:
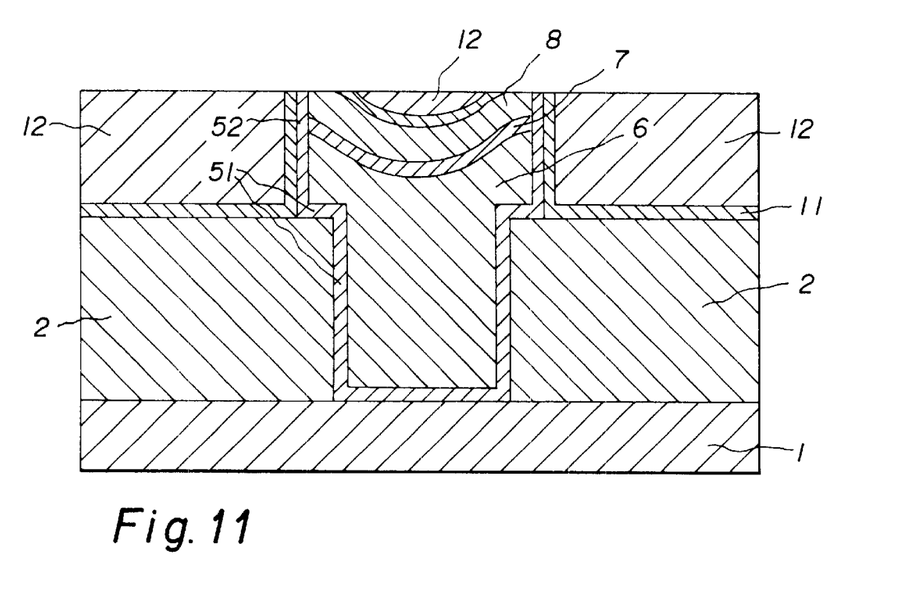
FIG. 11 is a sectional view of the layered structure after chemical-mechanical polishing.

In order to be able to planarize the second insulating layer 12, the insulating layer 12 is chemical-mechanically polished (CMP) so that a layer structure as shown in FIG. 11 is produced.

Figure 12:
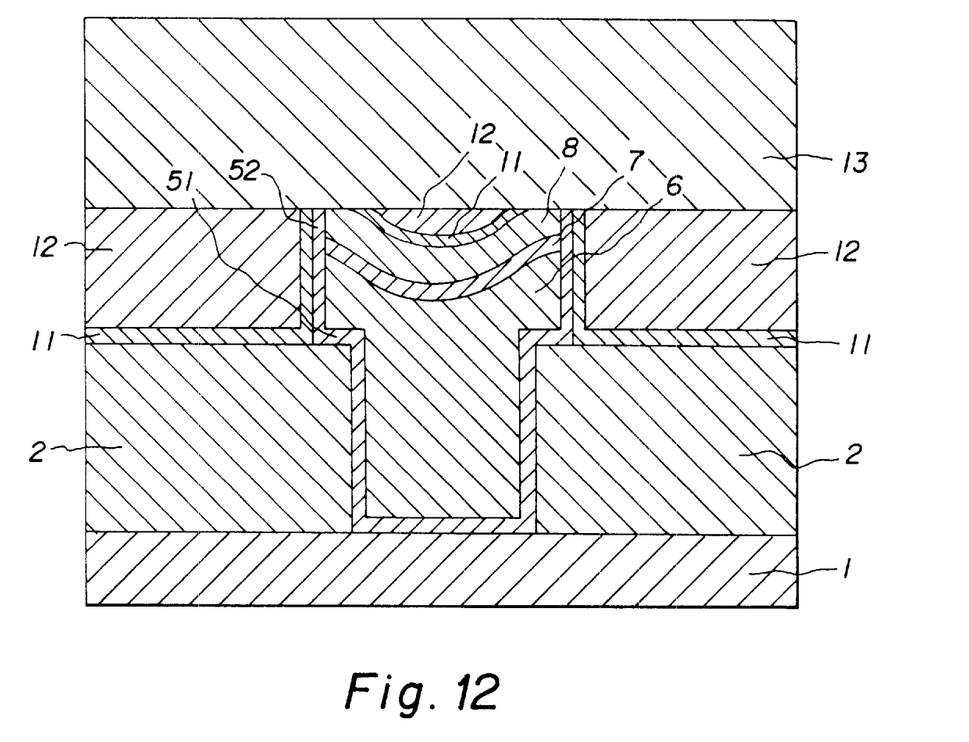
FIG. 12 is a sectional view of the layered structure with the optional third passivation layer and a third insulating layer.

A third insulating layer 13, which can also be an oxide, is applied above the second insulating layer 12, as shown in FIG. 12. The third insulating layer 13 has a layer thickness of approximately 600 nm. The insulating layer 13 can in turn be structured, as shown in FIG. 1. A repetition of the above-mentioned process steps is thus possible. Overall, an integrated circuit with a plurality of metal layers can thus be produced by repeating the previous process steps.

In comparison with the dual damascene method, the method according to the invention has the advantage that a fence is not formed during the etching of the tracks at the edge of the contact hole. In the dual damascene process, this fence can disadvantageously lead to a reduced metal cross section. This can result in reliability problems, that is to say under certain circumstances the metal conductor tracks do not comply with the necessary electrical properties (low ohmic resistance).

A further advantage of the method according to the invention relates to the fact that the copper can be etched by reactive ion etching at a high temperature because the hard mask 8 does not evaporate. The temperature which is necessary for the reactive ion etching can be provided by cathode/ESC heating or lamp heating (for example halogen lamps) of the wafer by the top window of the chamber or possibly even from below. It is also possible to produce the necessary temperature by selective heating of the wafer surface, for example by an Ar/Xe sputtering step on the second passivation layer 5 with a high RF power and switching off the wafer cooling.

The immediate passivation of the side walls by the specific process control according to the invention advantageously avoids the phase which is critical in terms of the corrosion of the copper, namely the wafer transfer or the time period from the end of the etching process up to the cleaning and subsequent passivation.

FIGS. 10, 11 and 12 show the third passivation layer 11, but because it is optional the layer structures according to FIGS. 10, 11 and 12 are also possible without the third passivation layer 12.

The method according to the invention can be readily used for a very wide variety of types of semiconductor circuits.

We claim:

1. A method for manufacturing a conductor structure for an integrated circuit, which comprises the steps of:
   providing a structured, insulating layer;
   applying a first passivation layer to the structured, insulating layer;
   applying a layer of conductive material to the first passivation layer;
   applying a second passivation layer to the layer of conductive material;
   applying a hard mask to the second passivation layer;
   removing the layer of conductive material in regions defined by the hard mask; and
   removing the first passivation layer in the regions defined by hard mask by sputtering and parts of the first passivation layer are at least partially deposited again on a side wall of the layer of conductive material.

2. The method according to claim 1, which comprises removing the layer of conductive material by reactive ion etching.

3. The method according to claim 1, removing the layer of conductive material by sputtering.

4. The method according to claim 1, which comprises forming the layer of conductive material from copper.

5. The method according to claim 1, which comprises forming the layer of conductive material to have a thickness of between 300 nm and 500 nm.

6. The method according to claim 1, which comprises forming the first passivation layer and the second passivation layer from a material selected from the group of tantalum, tantalum nitride, and a compound formed of tantalum and tantalum nitride.

7. The method according to claim 1, which comprises forming the structured insulating layer from a material selected from the group consisting of silicon oxide and a material with a dielectric constant which is lower than that of the silicon oxide.

8. The method according to claim 1, which comprises forming the hard mask from a material selected from the group consisting of silicon oxide, silicon nitride, and silicon oxynitride.

9. The method according to claim 1, which comprises forming the hard mask with a thickness of between 100 nm and 300 nm thick.

10. The method according to claim 1, which comprises forming the first passivation layer and the second passivation layer with a thickness of approximately 20 nm.

11. The method according to claim 1, which comprises providing a third passivation layer on a top surface.

12. The method according to claim 1, which comprises providing a further insulating layer on a top surface.

13. The method according to claim 12, which comprises chemical-mechanically polishing the further insulating layer.

14. The method according to claim 1, which comprises during the sputtering step, cooling the conductor structure.

15. The method according to claim 1, which comprises feeding in nitrogen in during the sputtering.

16. The method according to claim 1, which comprises producing the structured, insulating layer by reactive ion etching.

17. The method according to claim 1, which comprises structuring the layer of conductive material by heating and subsequent reactive ion etching.

18. The method according to claim 1, which comprises producing the hard mask by the steps of:
    depositing a hard mask material by a chemical vapor deposition process to the second passivation layer;
    applying an antireflex layer on the hard mask material;
    applying a photoresist mask on the antireflex layer;
    removing the hard mask material by etching in regions defined by the photoresist mask; and
    removing the antireflex layer and the photoresist mask.

* * * * *